June 23, 1959 M. V. MACHA 2,891,882

TREATMENT OF SEMICONDUCTORS

Filed July 5, 1957

INVENTOR.
MILO V. MACHA

BY D. Gordon Angus
ATTORNEY 2,891,882

TREATMENT OF SEMICONDUCTORS

Milo V. Macha, Los Angeles, Calif., assignor to International Rectifier Corporation, El Segundo, Calif., a corporation of California Application July 5, 1957, Serial No. 670,268

15 Claims. (Cl. 148—1.5)

This invention relates to semi-conductor rectifiers, and to a method for producing the same, free of surface impurities.

It is well known that the operation of semi-conductor rectifiers is adversely affected by impurities on the surface thereof. This is particularly true in rectifiers of the type known as "crystal junction" rectifiers, such as metallic germanium and metallic silicon types. Unfortunately, the components which make up these rectifiers must ordinarily undergo so many physical treatments and handlings in manufacturing that some surface contamination has been almost inevitable when these devices were made in accordance with previously known manufacturing techniques. While it is possible to clean exposed rectifier surfaces after manufacture, this is not possible in hermetically sealed types, and in these types the problem of contamination is therefore more serious.

Accordingly, an object of this invention is to provide a method and means for rendering harmless the contaminants which tend to reach the surface of the rectifier in the course of manufacture, and to provide a mechanical protection to prevent any more of these contaminants from reaching said surface during and after the process of assembling the rectifier.

Harmful contaminants list in two principal physical states: "ionic" and "atomic." A feature of this invention resides in applying to the surface concerned a layer of an organic amphoteric hydrophilic colloid for reacting with the ionic surface impurities, and thereafter heating the said colloid to dry it to a substantially water-insoluble composition which provides mechanical protection against contamination by atomic impurities.

Figures 1, 2:
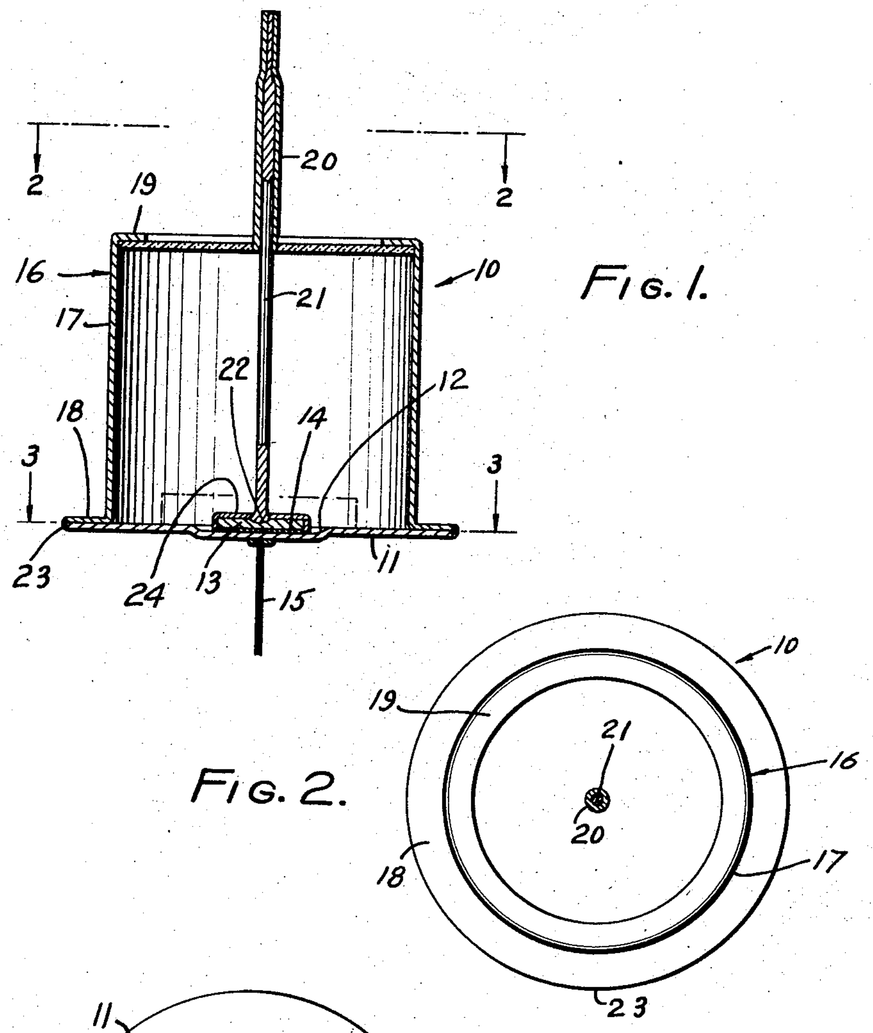

The above and other features of this invention will be fully understood from the following detailed description and the accompanying drawings of which:

Fig. 1 is a cross-section view of a rectifier according to this invention; and

Figure 3:
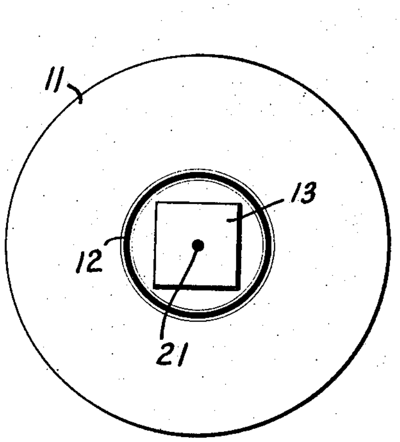

Figs. 2 and 3 are cross-sections taken at lines 2—2 and 3—3 respectively, of Fig. 1.

Crystal junction type rectifiers are provided with a P–N junction in which the N-type material is generally a wafer of some semi-conductive material such as metallic germanium or metallic silicon. The P-type material is ordinarily a metal selected from group III of the periodic table of elements, or an alloy of said group III metals. When germanium is used as the N-type material, indium is ordinarily preferred for the P-type material. When silicon is used as the N-type material, then aluminum is ordinarily preferred for the P-type material. In the example given below, a silicon type rectifier will be described in which aluminum is used as the P-type material. It will be understood that the usefulness of this invention is not limited to rectifiers using silicon and aluminum nor is it limited to crystal junction rectifiers. Rather, this invention is useful to prevent the contamination of surfaces of many types of rectifiers. However, this invention is primarily useful in the manufacture of crystal junction rectifiers, particularly of the type which are to be hermetically sealed.

Fig. 1 shows an assembled rectifier 10 incorporating the invention. A base plate 11 is dimpled at 12 to form a sink in which a wafer 13 of silicon is conductively attached to the said base plate by solder 14. A wire 15 is soldered to the base plate on the opposite side from the wafer.

Means are provided for enclosing the wafer, and include an envelope 16. This envelope has a tubular portion 17 with an outwardly directed flange 18 at its lower end, and an inwardly directed flange 19 at its upper end. A sleeve 20 is held by a glass seal which is fastened to flange 19.

An aluminum rod 21 is fused at one of its ends to the upper surface of the wafer, and the line 22 represents a region of diffusion of the aluminum into the silicon which forms the P–N junction. The rod passes into the sleeve, and the sleeve and rod are crimped together. Flange 18 on the envelope is edge-welded to the base plate as shown at 23.

A layer 24 is provided on the exposed surface of the silicon wafer as set forth below to protect them from contamination.

The invention will be best understood in terms of the process of assembling this rectifier. After the wafer has been cut and cleaned, it is soldered to the base plate. Then the rod and the base plate are held in abutment in a suitable jig, and placed in a furnace in a hydrogen atmosphere. This fuses the aluminum and the silicon to form the junction.

Preferably the assembled P–N junction is then given an etching treatment, for example in a mixture of nitric and hydrofluoric acid, with a subsequent rinsing by distilled water followed by a drying treatment. The etching will remove surface impurities on the crystal and will clean the junction of both ionic and atomic impurities.

Nevertheless, regardless of how much the surfaces of the wafer are washed and dried, it will ordinarily be found that there are still some ionic-type impurities remaining from the previous acid treatments and other handlings, such as various radicals like chloride, nitrate, and the like. It has been found that these contaminants on the surface of the wafer, even in tiny concentrations of a few parts per million parts of silicon, can cause a considerable reduction in the efficiency of the rectifier. Some means is therefore desirable to eliminate these ionic impurities without simultaneously introducing impurities from the means used for further cleaning. As an example of the difficulty of carrying out such a manufacturing process, it has been found that even the low concentration of stray ions which exist in the purest water obtainable may contaminate the surface of the rectifier crystal. Thus, even the most meticulously prepared cleaning agent may be a source of trouble. In carrying out the process of this invention, it is assumed that such contamination will occur, and the invention provides means for removing such contamination. After the crystal is washed clean of atomic impurities, then, for the purpose of removing the residual ionic impurities, a solution of an organic amphoteric hydrophilic colloid is applied to the exposed surface of the wafer. The preferred substance of this type appears at the present time to be a 2% by weight aqueous solution of commercial gelatine of a pH value adjusted close to the isoelectric point. This pH value for gelatin solution is in the neighborhood of 4.7. Commercial gelatine is a protein made up of a mixture of various types of amino acids. It is well known that these amino acids are amphoteric; that is, they will react as bases with acidic ions, and will react as acids with basic ions. Therefore, regardless of the nature of the ionic charge of the impurities on the surface of the wafer, these amino acids will react therewith to form a stable neutral salt, and will thereby draw the ions into the body of the gel. This effectively removes these impurities from the surface of the wafer.

Gelatine forms either a gel or a sol depending on the temperature. This change in physical state is reversible as a function of temperature or pH value, unless the gelatine is heated above a critical temperature at which a process known as "aging" occurs. At this point, water is driven out of the gelatine. In the practice of the present method the temperature is raised sufficiently to produce this aging. The layer then becomes substantially water-insoluble, and forms a hard shell-like covering on the wafer. The loss of water occurs gradually, and when the wafer is heated the gel ages to force a gas-free, thin, uniformly hard surface cover. This aging process is preferably carried out in a vacuum at approximately 150° C. when gelatine is used as the colloid.

The dried, de-hydrated gelatin product which results from heating the gelatine to produce the aging forms a hard layer 24 which is shown disproportionately thick with respect to the thickness of the wafer 13 and the base plate 11 for purpose of illustration. This layer 24 is stable so that it is no longer able to be reversed by factors such as temperature change or water back to a sol. The ionic impurities are held within this layer, having combined with the amphoteric colloid.

The substances suitable for making layer 24 are the organic, hydrophilic, amphoteric colloids. Amino acids are the preferred colloids of this type, and any amino acid alone, or in combination with any other amino acid or acids will serve the purpose. Examples of such amino acids are: alanine, arginine, aspartic acid, crystine, glutamic acid, clycine, histidine, hydroxyglutamic acid, hydroxyproline, leucine, lysine, phenylalanine, proline, serine, tryptophane, tyrosine and valine. Proteins consist essentially of mixtures of various of the foregoing amino acids, and are themselves organic, hydrophilic, amphoteric colloids. Any protein, or mixture of proteins will serve to make layer 24. Examples of such proteins are: gelatine, casein, egg albumin, gliadin, keratin and zein. Gelatine is the preferred substance for use in this invention because of its low cost, availability, and favorable gelling and aging properties. Casein is another especially suitable protein.

After the aforesaid gelatine treatment of the wafer, the remainder of the assembly process is carried out. The envelope 16 is placed atop the base plate, with its outer flange 18 in abutment with the base plate. Rod 21 passes into the sleeve 20. Then the said flange is welded to the base plate at 23, and the end of the sleeve is crimped onto the rod by pressing in a spot-welder. Before being spot welded, and after the flange is welded to the base plate, the device is set in an evacuated vacuum oven at 150° C. for a time. Then it is directly transferred to a nitrogen box maintained at an elevated temperature, and the spot-welding is performed therein. The space within the envelope then contains only nitrogen gas, and the device is hermetically sealed.

It will be recognized that the welding and spot-welding processes might introduce atomic impurities into the envelope. This is not important in this device, because layer 24 prevents these impurities from coming into contact with the wafer. It will be seen that this invention provides a method for manufacturing a rectifier in which the surfaces of the rectifying element are thoroughly cleaned of ionic impurities, and in which the surface is physically protected from later contamination by atomic type impurities. This invention enables these advantages to be obtained in a hermetically sealed construction, which is in itself an important advantage, for the very act of making the hermetic seal might tend to contaminate the crystal rectifier were it not for the protective layer. Evidently, it would not be possible to clean the crystal inside the rectifier after manufacture because such cleaning actions would require destruction of the structure itself.

This invention thereby provides means for cleaning residual ionic impurities from the surface of the wafer, and also means for preventing further contamination.

This invention is not to be limited to the embodiment shown in the drawing and described in the description, which is given by way of example and not of limitation, but only in accordance with the scope of the appended claims.

I claim:

1. A method of protecting the surface of semi-conductors from impurities comprising depositing a layer of an organic amphoteric hydrophilic colloid on said surface and subjecting said layer to sufficient heat to dry the same to a substantially water insoluble condition.

2. A method according to claim 1 wherein said drying is done in a vacuum.

3. A method of protecting the surface of semi-conductors from impurities comprising depositing an aqueous colloidal solution of amino acids upon said surface, and thereafter subjecting said acids to sufficient heat to dry said acids to a substantially water insoluble condition, leaving the dried product of the heated acids as a layer upon said surface.

4. A method according to claim 3 in which a protein is placed in said solution to provide said amino acids.

5. A method according to claim 4 in which the protein consists of gelatine.

6. A method according to claim 4 in which the protein consists of casein.

7. An article of manufacture comprising a wafer of semi-conductive metal having a surface, and a layer on said surface consisting essentially of the product obtained by applying and heating an organic amphoteric, hydrophilic colloid on said surface and thereby drying the colloid to a substantially water-insoluble condition.

8. An article according to claim 7 in which the colloid is an amino acid.

9. An article according to claim 7 in which the colloid is a protein.

10. An article according to claim 7 in which the colloid is gelatine.

11. An article according to claim 7 in which the colloid is casein.

12. A method of manufacturing a P–N junction which includes a wafer of a semi-conductive metal having a surface, to which surface is to be joined a body of dissimilar metal, comprising: etching and washing said surface of the wafer, drying said surface, applying an aqueous organic amphoteric, hydrophilic colloid, heating the said colloid to dry the colloid to form a layer consisting essentially of a substantially water-insoluble product, and thereafter soldering the body and wafer together at said surface, whereby the said aqueous colloid acts to remove ionic impurities from the surface before being dried, and said layer after drying provides the said surface with mechanical protection against atomic impurities by covering the same, a susbtantially uncontaminated surface thereby being obtained.

13. Method according to claim 12 in which the wafer is made of a metal selected from the group consisting of germanium and silicon, and in which the colloid is a protein.

14. Method according to claim 13 in which the protein consists essentially of gelatine.

15. Method according to claim 13 in which the protein consists essentially of casein.

References Cited in the file of this patent

UNITED STATES PATENTS 2,768,100 Rulison ---------------- Oct. 23, 1956